(12) United States Patent
Zack et al.

(10) Patent No.: US 7,106,098 B1
(45) Date of Patent: Sep. 12, 2006

(54) SPLIT FIFO CONFIGURATION OF BLOCK RAM

(75) Inventors: Steven J. Zack, Burlington, NJ (US); William E. Allaire, West Chester, PA (US)

(73) Assignee: Xilinx, Inc., San Jose, CA (US)

(\*) Notice: Subject to any disclaimer, the term of this patent is extended or adjusted under 35 U.S.C. 154(b) by 12 days.

(21) Appl. No.: 10/839,630

(22) Filed: May 4, 2004

(51) Int. Cl.
*H03K 19/177* (2006.01)

(52) U.S. Cl. .............................. 326/40; 326/38; 326/46

(58) Field of Classification Search ............ 326/37–41, 326/46–47
See application file for complete search history.

(56) References Cited

U.S. PATENT DOCUMENTS 4,942,553 A 7/1990 Dalrymple et al.
6,751,723 B1* 6/2004 Kundu et al. ................. 712/36
6,838,902 B1* 1/2005 Elftmann et al. ............. 326/40
6,864,710 B1* 3/2005 Lacey et al. .................. 326/39

OTHER PUBLICATIONS

U.S. Appl. No. 10/838,958, filed May 4, 2004, Zack et al.
U.S. Appl. No. 10/838,957, filed May 4, 2004, Lowe et al.

\* cited by examiner

*Primary Examiner*—Anh Q. Tran
(74) *Attorney, Agent, or Firm*—Scott Hewett; John J. King (57) ABSTRACT

A programmable logic device includes a block random access memory ("BRAM") that is split into two first in, first out ("FIFO") memory arrays. Two sets of FIFO control logic and FIFO ports are associated with a single BRAM so that the BRAM can be operated as memory buffers for two independent FIFO memory systems.

20 Claims, 6 Drawing Sheets

SPLIT FIFO CONFIGURATION OF BLOCK RAM

FIELD OF THE INVENTION

This invention relates generally to digital logic devices, and more particularly to devices and methods for configuring a single block of random access memory ("RAM") to function as multiple first in, first out ("FIFO") memory systems.

BACKGROUND OF THE INVENTION

FIFO memory systems are used in a wide variety of applications, such as buffering high-speed serial data immediately after it has been parallelized, for temporary storage of a data packet during packet processing, or buffering data going to or coming from a disk. Data values that are sequentially written to a FIFO buffer are read from the FIFO buffer in the same order, namely the first data entered into the FIFO memory system is the first data read from the FIFO memory system.

FIFO buffers are implemented in RAM and the flow of data into and out of RAM is controlled by address counters that track the read and write addresses being used. The address counters coordinate the data flow into and out of RAM to insure that memory is available to accept incoming data to prevent overflowing the RAM, and that data is stored in RAM before a read operation executes.

Several status flags are available in FIFO memory systems, such as FIFO FULL and FIFO EMPTY, which indicates the RAM is either full or empty, which indicate that there is sufficient space in RAM for a WRITE to occur or sufficient data in RAM for a READ to be performed. For example, if a WRITE function is to be enabled, the FIFO FULL status flag will indicate whether the data can be written into memory. If a read is to be performed, the FIFO EMPTY status flag will indicate whether there is any data available in the FIFO.

FIFO memory systems can be synchronous or asynchronous. A FIFO memory system in which both the read address counter and the write address counter are clocked by the same clock signal is referred to as a synchronous FIFO memory system. In contrast, a FIFO memory system in which the read address counter and the write address counter are clocked by different clock signals is referred to as an asynchronous FIFO memory system. Asynchronous FIFO memory systems are extremely useful in digital data systems where different sides of the FIFO memory system are independently clocked, either at different clock rates, or at the same clock rate, but with a phase difference ("skew").

In both synchronous and asynchronous FIFO systems, the read and write address counters are circular counters that wrap around to an initial address after the last address is accessed. The read and write address counter output signals are either multiplexed to address a single-port random access memory (RAM), or they are separately provided to address different input ports of a multi-port RAM (e.g. a dual-port RAM).

FIFO memory systems have been implemented in PLDs using the fabric of the PLD to provide the control logic, generate the status flags, and provide the write and read addresses of FIFO memory systems. Such FIFO memory systems are described in co-owned U.S. Pat. Nos. 5,898,893 and 6,434,642, the disclosures of which are hereby incorporated in their entirety for all purposes. The logic for operating the FIFO memory system is typically developed in configurable logic blocks ("CLBs") surrounding an embedded block of RAM (embedded "BRAM"), and the embedded BRAM or distributed memory is operated as a FIFO buffer.

It is often desirable to provide many FIFO memory systems in a single PLD, such as for use in digital networking systems that have many clock domains. This consumes both memory and CLBs, limiting their availability for other applications. FIFO memory systems often require buffers that are inefficient to implement in distributed memory, but use only a fraction of a dedicated BRAM, which unnecessarily consumes PLD resources. If a user requires many FIFO memory systems on a single PLD, much of the device's embedded BRAM resources may be allocated as FIFO buffers but not fully utilized. In some instances, the number of BRAM ports in a PLD, rather than the number of CLBs, may become the limiting factor.

Therefore it is desirable to provide a PLD with more efficient use of device resources, and to provide more FIFO memory systems on a PLD.

SUMMARY OF THE INVENTION

The present invention enables PLDs with FIFO memory systems that split a BRAM into two FIFO buffers. In some embodiments, a FIFO memory system using split BRAMs enables more efficient use of memory resources. In a specific embodiment, additional FIFO memory systems are configured using the BRAM existing on a PLD. In alternative embodiments, split BRAMs are combined to operate as a single memory array, either in parallel, providing greater width, or in series, providing greater depth, of the FIFO memory system.

In a particular embodiment, a programmable logic device includes an embedded block of random access memory ("BRAM"). A first write clock port is configured to couple a first write clock signal to the BRAM, and a first read clock port is configured to couple a first read clock signal to the BRAM. Similarly, a second write clock port is configured to couple a second write clock signal to the BRAM and a second read clock port is configured to couple a second read clock signal to the BRAM. The write and read clocks for both portions of the BRAM may operate in different time domains.

In some embodiments, FIFO control logic is embedded in the programmable logic device. Alternatively, some or all of the FIFO control logic is configured in the fabric of the programmable logic device. In a particular embodiment, the FIFO logic is embedded in or next to a BRAM of the programmable logic device. Alternatively, some of the FIFO logic is embedded and some is configured in the fabric.

In some embodiments, additional I/O lines are provided to the BRAM to provide each portion of the split BRAM with the full data width. In a further embodiment, the portions of the split BRAM are operated as a single BRAM with an extra-wide data bus.

DETAILED DESCRIPTION OF THE DRAWINGS

Figure 1A:
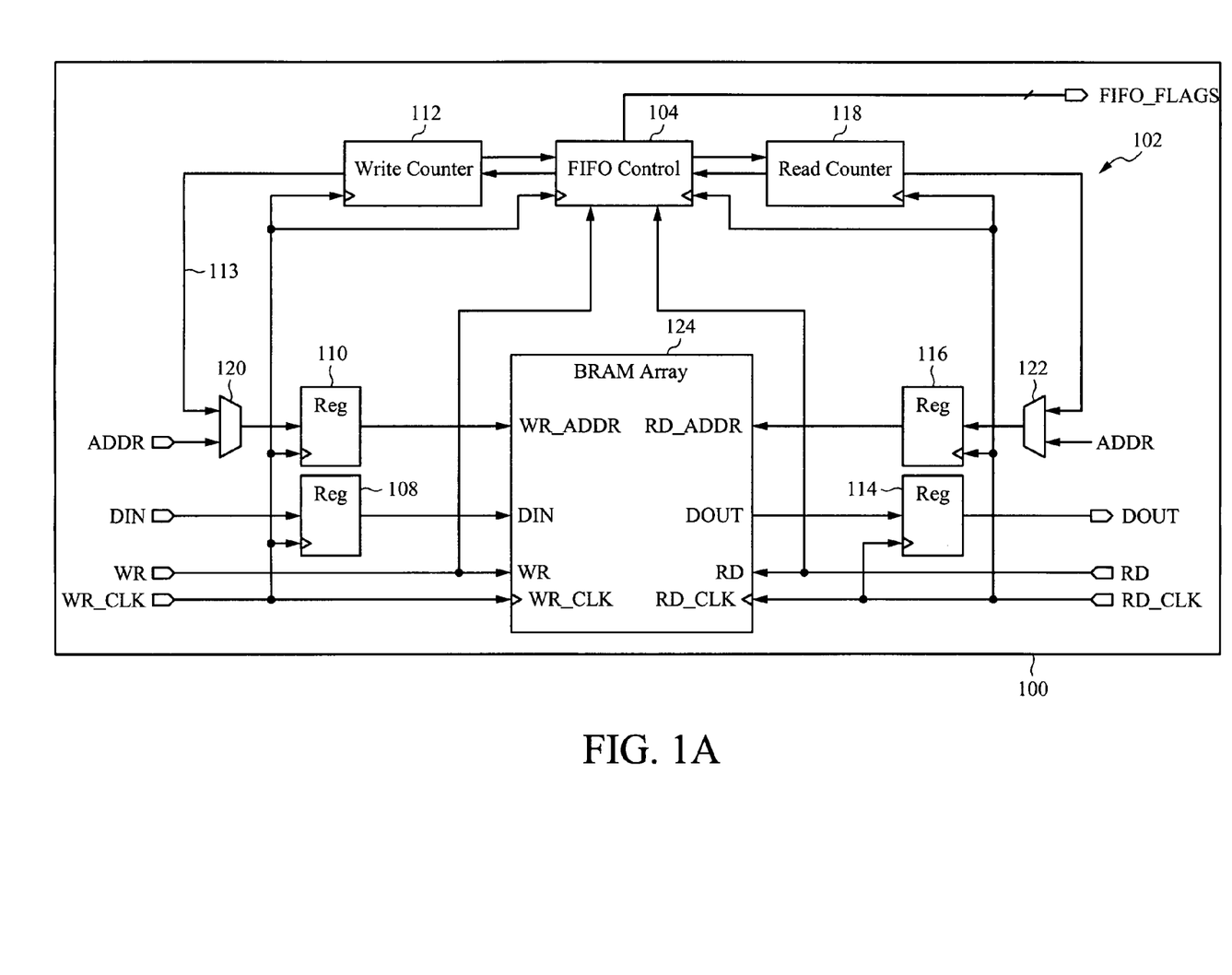
FIG. 1A is a simplified diagram of a PLD with a FIFO memory system having an embedded FIFO controller according to an embodiment of the present invention using a dual-port memory array.

FIG. 1A is a simplified diagram of a PLD 100 with a FIFO memory system 102 having an embedded FIFO controller 104 according to an embodiment of the present invention. The FIFO controller 104 is embedded in the PLD 100, typically next to an embedded BRAM 124 (hereinafter "BRAM"). Data is provided to the BRAM 124 over data input line DIN and is clocked by the write clock signal on line WR_CLK. The write clock signal is provided to optional input registers 108, 110 and to the write counter 112, all of which are embedded in the PLD 100, typically next to the BRAM array 124. In some embodiments these optional registers 108 and 110 may or may not be present. In one embodiment, the write counter 112 does not go through a register since its output is already registered. However, the ADDR input does go through register 110 (i.e., ADDR input goes directly into register 110 and the multiplexer 120 is moved in order to select between the output of register 110 and the output of the write counter 112). Optional output registers 114, 116, read counter 118, and multiplexers 120, 122 are also embedded in the PLD 100, typically next to the BRAM array 124. In some embodiments these optional registers 114 and 116 may or may not be present. In one embodiment, the read counter 112 does not go through a register. However, the ADDR input does go through register 116 (i.e., ADDR input goes directly into register 116 and the multiplexer 122 is moved in order to select between the output of register 116 and the output of the read counter 118). "Embedded" means that the logic of these components is hard-wired in silicon, as opposed to being configured in the fabric of the PLD. The multiplexers and registers, which are relatively simple compared to the FIFO controller, are alternatively configured in the fabric of the PLD.

Figure 1B:
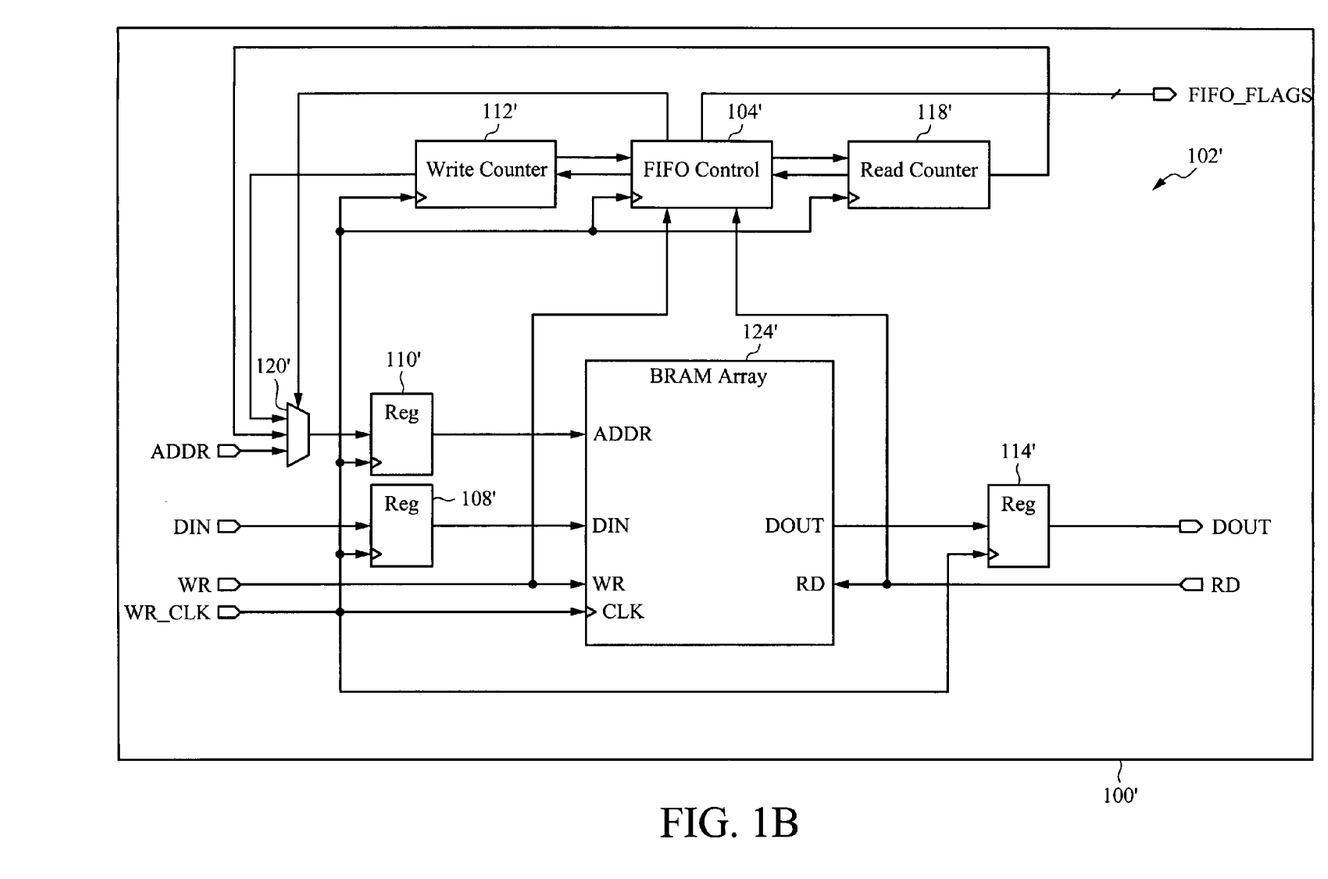
FIG. 1B is a simplified diagram of a PLD with a FIFO memory system having an embedded FIFO controller according to an embodiment of the present invention using a single-port memory array.

The BRAM 124 operates as a FIFO memory array that provides the memory used in the FIFO memory system. The BRAM 124 operates in a manner consistent with conventional dual-port RAM circuits, and is therefore not described in additional detail. Alternatively, a single-port memory array is used, as shown in FIG. 1B. Similarly, the write counter 112, read counter 118, registers 108, 110, 114, 116 and multiplexers 120, 122 are implemented using known techniques. Like for FIG. 1A above, registers 108 and 110 are optional. In one embodiment the outputs of write counter 112 and read counter 118' need not be go through register 110. In addition output register 114 is also optional. The multiplexers 120, 122 allow selecting between external addressing for non-FIFO operation and write counter 112 for operation of the BRAM in a FIFO memory system. In other words, the write address comes from outside of the FIFO memory system on ADDR when the BRAM 124 is being used as a conventional memory array, and on line 113 from the write counter 112 when the BRAM 124 is being used in a FIFO memory system. The multiplexer 122 operates in a similar fashion with the read counter 118.

Data is read from the BRAM 124 over line DOUT, which is clocked by the read clock signal on line RD_CLK. The FIFO flags FULL, EMPTY, ALMOST FULL and ALMOST EMPTY are provided on FIFO_FLAGS to other elements (not shown) of the PLD or of a digital system (not shown) in which the PLD is used. For example, a FIFO FULL flag is provided to a data source of a digital system to indicate whether data can be written to the FIFO memory system, and a FIFO EMPTY flag is provided to a data destination of the digital system to indicate whether data is available from the FIFO memory system.

Register 108 allows pipelining of the input data to improve the speed of the FIFO memory system when writing data to the BRAM 124 when enabled by the write WR. Register 114 holds read data from the BRAM array 124 and allows pipelining of the output data to improve the speed of the FIFO memory system when enabled by the read RD. In one embodiment, the WR and/or RD signals may each go through an optional register (not shown). One reason the WR signal may be registered is so that the WR signal is time-aligned with the DIN signal(s). The read and write clocks are synchronous, skewed, or asynchronous in alternative embodiments. Optional registers 110, 116 are used to register the write and read addresses. These registers may be bypassed in some applications.

The write counter 112 and the read counter 118 provide the write and read address to the multiplexers 120, 122, and support different FIFO depths so that the FIFO flag logic will function correctly as the depth of the FIFO is changed. The depth of the FIFO memory is dependent on the width of the data bus (i.e. DIN) of the FIFO memory system, which is 36 bits in a particular FPGA, but is generally variable from 4, 9, 18, or 36 bits in width.

The embedded FIFO controller 104 accepts user commands at boot-up (power on) to configure the FIFO memory system to a selected width and/or depth. Generally, for a memory array of a given size, selecting the data width will determine the depth of the memory array. Similarly, a user can program the embedded FIFO controller 104 to set the FIFO ALMOST FULL and FIFO ALMOST EMPTY flags at a selected level. For example, the user selects the FIFO ALMOST FULL flag to be generated when the FIFO memory array is ⅞-full in one application, and when the FIFO memory array is ¾-full in another application. Adding an optional register(s) to the FIFO logic provides dynamic setting of the levels of the FIFO status flags and the width of the FIFO.

The embedded FIFO controller 104 is designed for use with the BRAM array 124 to provide a FIFO memory system capable of operating at higher speeds than similar FIFO memory systems where the FIFO controller is configured in the fabric of the PLD. Embedding the FIFO controller in the silicon, rather than in the fabric, is estimated to provide a 10% to 30% improvement in the FIFO memory system operating speed because of the faster clock rate (typically 300 MHz to 600 MHz) for an embedded FIFO controller. The clock rate for a FIFO controller configured in a CLB of the fabric of the PLD 100 is currently about 250 MHz to 275 MHz. The increased speed of FIFO memory systems with embedded logic is particularly desirable as the clock rates of the input and output data increase.

FIG. 1B is a simplified diagram of a PLD 100' with a FIFO memory system 102' having an embedded FIFO controller 104' according to an embodiment of the present invention using an embedded single-port memory array 124'

(i.e. a single-port embedded BRAM). FIFO memory systems using single-port memory arrays are familiar to those in the art, and many features are similar to the FIFO memory system illustrated in FIG. 1A, above. FIFO logic, such as write counter 112', read counter 118', FIFO controller 104', multiplexer 120', and registers 110', 108', and 114' are embedded in the PLD 100'. Alternatively, the multiplexer and registers are configured in the fabric of the PLD.

A single clock signal is provided on WR_CLK to register 108' and to register 114' (to clock data in and data out, respectively). The read counter 118' is coupled to multiplexer 120' to provide the address to the single-port BRAM 124' after a read operation. Thus, the address may come from the write counter 112', the read counter 118', or outside of the FIFO memory system 102' on line ADDR, if the single-port BRAM is to be operated as a conventional single-port memory array. The increased speed of the FIFO memory system 102' with embedded logic 104', 112', 118' is particularly desirable as the clock rates of the input and output data increase.

Embedding the FIFO controller and other FIFO logic in silicon of the PLD, rather than configuring it in the fabric, also provides more reliable operation. When configuring the FIFO logic for an asynchronous FIFO memory system in a CLB of a PLD, the flags are often in transition due to some of the logic in the CLB being clocked in each time domain. The logic design required to generate FIFO status flags that function correctly without causing metastability issues can be very difficult to implement in the fabric. Flags in transition are more likely to result in operational errors.

FIFO logic configured in the fabric of a PLD may have timing errors arising from where in the fabric the logic is implemented (i.e. logic operating along different paths in the fabric), or timing errors that arise due to manufacturing variability of the PLD. With embedded FIFO logic, the FIFO logic design is verified to insure that the status flags are reliably generated for all specified operating conditions (e.g. asymmetric clock rates) and manufacturing tolerances. Similarly, embedding the FIFO logic in the BRAM relieves the user from having to generate code to configure the CLB to provide FIFO logic functions.

Embedding FIFO logic in a BRAM provides a high-speed, reliable FIFO memory system that operates in a consistent fashion in a variety of applications and greatly simplifies usage of FIFO memory systems in PLDs. The design cost and time is reduced because a FIFO memory system is provided as an operational component of the PLD. Embedding the FIFO logic also frees CLB resources for other functions. The amount of silicon area required to embed FIFO logic into a BRAM is modest, and much less than the equivalent silicon area that would be used configuring similar FIFO logic into the fabric of the PLD.

Figure 2A:
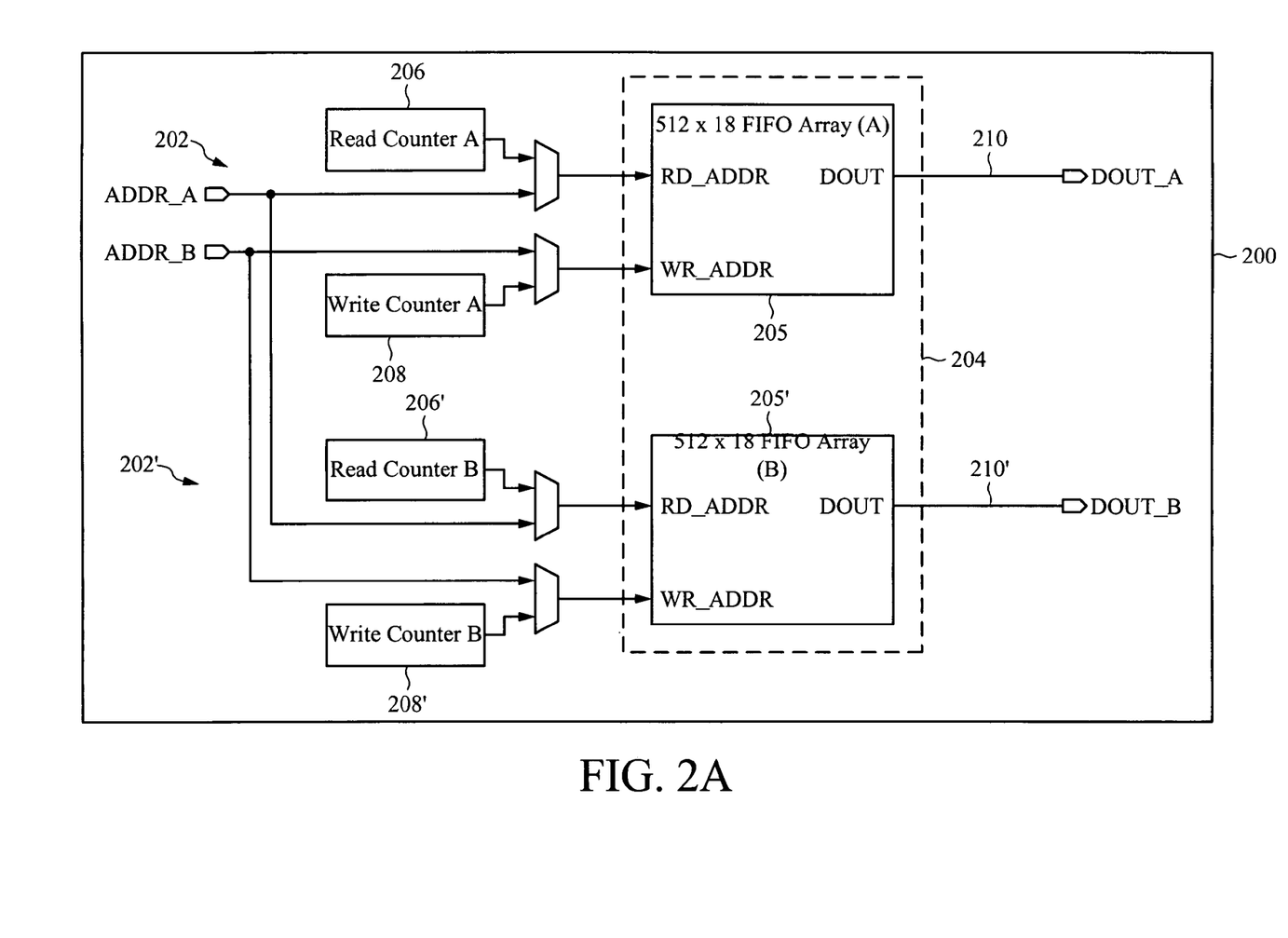
FIG. 2A is a simplified diagram of a PLD having FIFO memory systems using a single BRAM array.

FIG. 2A is a simplified diagram of a PLD 200 having FIFO memory systems 202, 202' using a single BRAM array 204. The FIFO logic functions are configured in the fabric (not separately shown) of the PLD, such as in one or more CLBs, or alternatively are embedded in the PLD. FIFO logic is embedded within BRAM in some embodiments and outside of BRAM in alternative embodiments. In other embodiments, a portion of the FIFO logic is embedded, and another portion of the FIFO logic is configured in the fabric. The BRAM 204 is operated as a single-port memory array, or alternatively as a dual-port memory array.

Conventional PLDs with FIFO memory systems allocate an entire BRAM for each FIFO memory system. Each FIFO memory system has a single write counter and a single read counter coupled to the BRAM that provide the write and read addresses to a BRAM. A single FIFO controller (see, e.g. FIG. 1, ref. num. 104) generates the status flags for the FIFO memory system. When a PLD is used in a digital system having many different time domains, such as in a design where data is being passed from one function to another, the user often needs several small asynchronous FIFOs between processing blocks. Often, a user might only need a number of 64×18 FIFO memory arrays, and has to choose between allocating an entire BRAM (and use only about $\frac{1}{16}^{th}$ of a typical memory block of a 1 K×18-bit memory array) or consuming 16 CLBs to implement the FIFO memory system in distributed RAM. Thus, substantial CLB and memory resources can be consumed, even for FIFO memory systems requiring relatively little memory.

The single BRAM 204 is split into two FIFO memory arrays 205, 205'. The first FIFO memory array 205 operates as a first independent dual-port RAM and the second FIFO memory array 205' operates as a second independent dual-port RAM. In other words, the BRAM 204 has a second, independent, set of data input/output ports, compared to a conventional BRAM. Alternatively, a single BRAM is split into two single-port memory arrays for use in two, independent FIFO memory systems.

In a particular embodiment, the PLD 200 is an FPGA and the BRAM 204 is a dual-port BRAM with a maximum I/O data width of 72 bits on each port and 12 address lines. Embodiments where the I/O buses are split into two dual-port 36-bit memory arrays for use in independent FIFO memory systems do not require additional I/O lines. The widths of the data buses should be independent between each portion of the split BRAM (FIFO memory array). The split FIFO mode replicates the flag and address counters for each side of the split BRAM (i.e. each FIFO memory system) and can use available unused address lines because the write/read addresses are generated locally by the FIFO logic. BRAMs are further divided in alternative embodiments, for example by splitting a BRAM into 3, 4, or more FIFO memory arrays, if sufficient data lines and ports are available.

It was found that many PLD users believe the total number of data ports is as important as the total amount of available memory (expressed in bits). Partitioning the BRAM 204 in to halves 205, 205' and adding an extra set of counters (e.g. Read Counter B 206' and Write Counter B 208') and control logic (see FIG. 2B, ref. num. 224') improves access to memory without increasing the amount of total memory or number of BRAMs on a PLD. The number of potential FIFO memory arrays is doubled, although the size of each individual FIFO memory array using the split BRAM is halved. If a user requires a large FIFO memory system, the portions of the BRAM can be combined so that they appear to function as a single, larger, FIFO memory array. Using split BRAMS, FIFO memory systems can be cascaded to provide a FIFO system with increased depth, or run in parallel to provide a FIFO system with increased width.

Figure 2B:
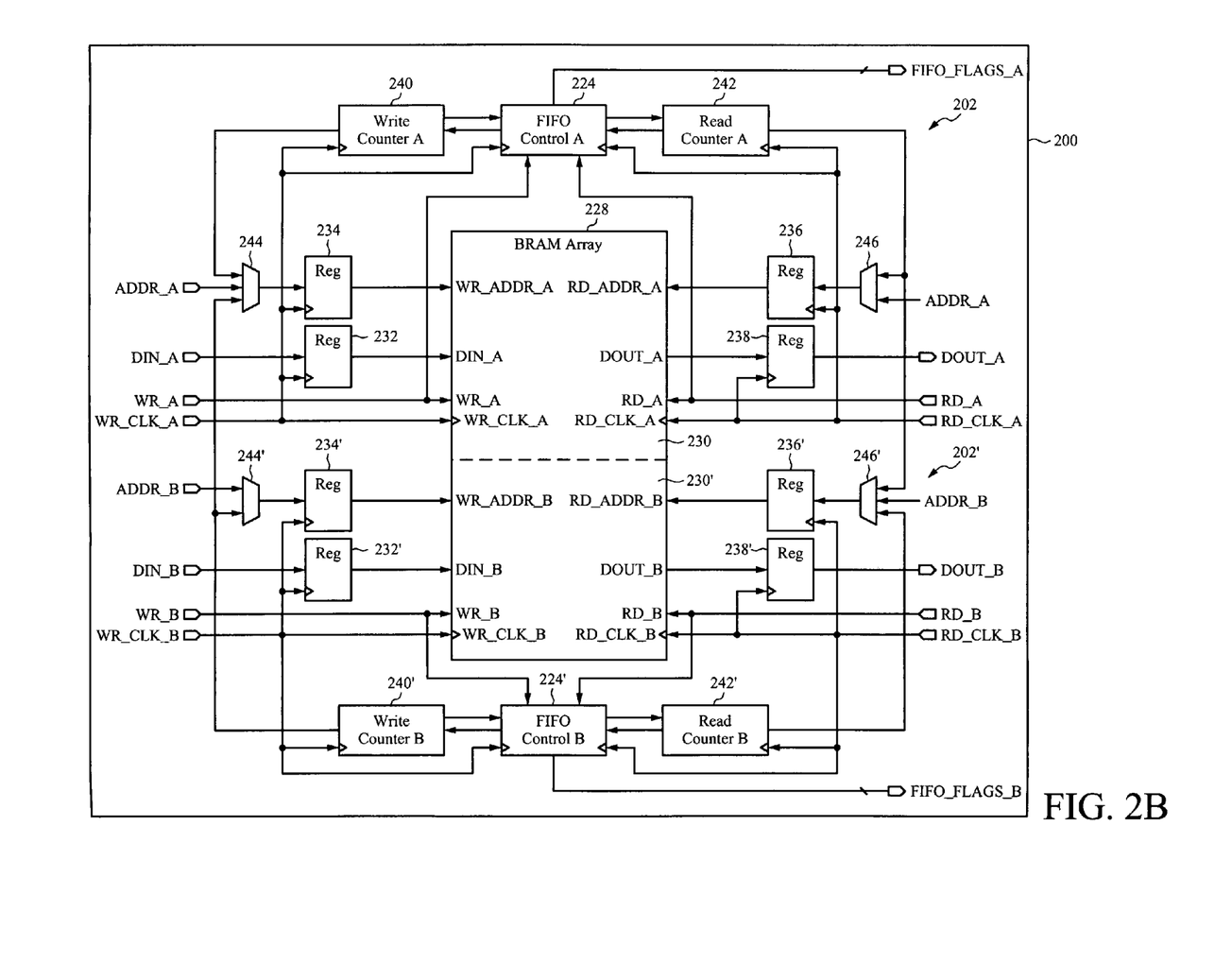
FIG. 2B shows additional details regarding the logic and ports of embedded FIFO memory systems using a split BRAM array.

FIG. 2B shows additional details regarding the logic and ports of embedded FIFO memory systems 202, 202' using a split BRAM array 228 in the PLD 200. FIFO logic, such as FIFO controllers 224, 224' are embedded in the PLD 200. Alternatively, FIFO logic is configured in the fabric of the PLD 200. The BRAM array 228 is split into sub-arrays 230, 230'. There is no physical division of the BRAM array 228, and it is shown as being divided by a dashed line only for purposes of illustration and discussion.

Additional logic has been embedded in the PLD 200 (compare FIG. 1A), such as registers 232', 234', 236', 238', FIFO controller 224', write counter 240', read counter 242', and multiplexers 244', 246'. Similarly, additional ports, such as a second write clock port WR_CLK_B (WR_CLK_A is alternatively considered the "additional" port), a second read clock port RD_CLK_B (RD_CLK_A is alternatively considered the "additional" port), and a second FIFO flag port FIFO_FLAGS_B are added. Registers 234, 234', 236, 236' are optional, as discussed above in relation to ref. nums. 110, 116 of FIG. 1.

In some applications, it is desirable to have FIFO memory systems that support the full data width on each half of the BRAM. In a PLD having a dual-port BRAM with a 36-bit data width on each port (i.e. 72 bits for data in and 72 bits for data out), splitting a BRAM to operate as two FIFO buffers does not require additional I/O lines if each half of the BRAM supports a FIFO memory system with an 36-bit data width.

BRAMs often have unused I/O lines. In a particular embodiment using a VIRTEX II™ FPGA, available from XILINX, INC. of San Jose, Calif., 24 unused address lines provide additional I/O lines for operating the FIFO memory system. Typically, only three to four lines are needed for each set of FIFO status flag; thus, no additional I/O lines would need to be added to the PLD to operate both FIFO memory systems 202, 202' at full (36-bit) width.

The FIFO memory systems 202, 202' shown in FIG. 2B are alternatively operated as a single FIFO memory system. When operating as a single FIFO memory system, DIN_A, WR_A, DOUT_B and RD_B are not used. Similarly, Writer Counter A 240, multiplexer 244, Read Counter B 242', multiplexer 246', and FIFO Control B 224' are not used. The unused ports and logic may be different in an alternative embodiment with suitable line routing.

Figure 3A:
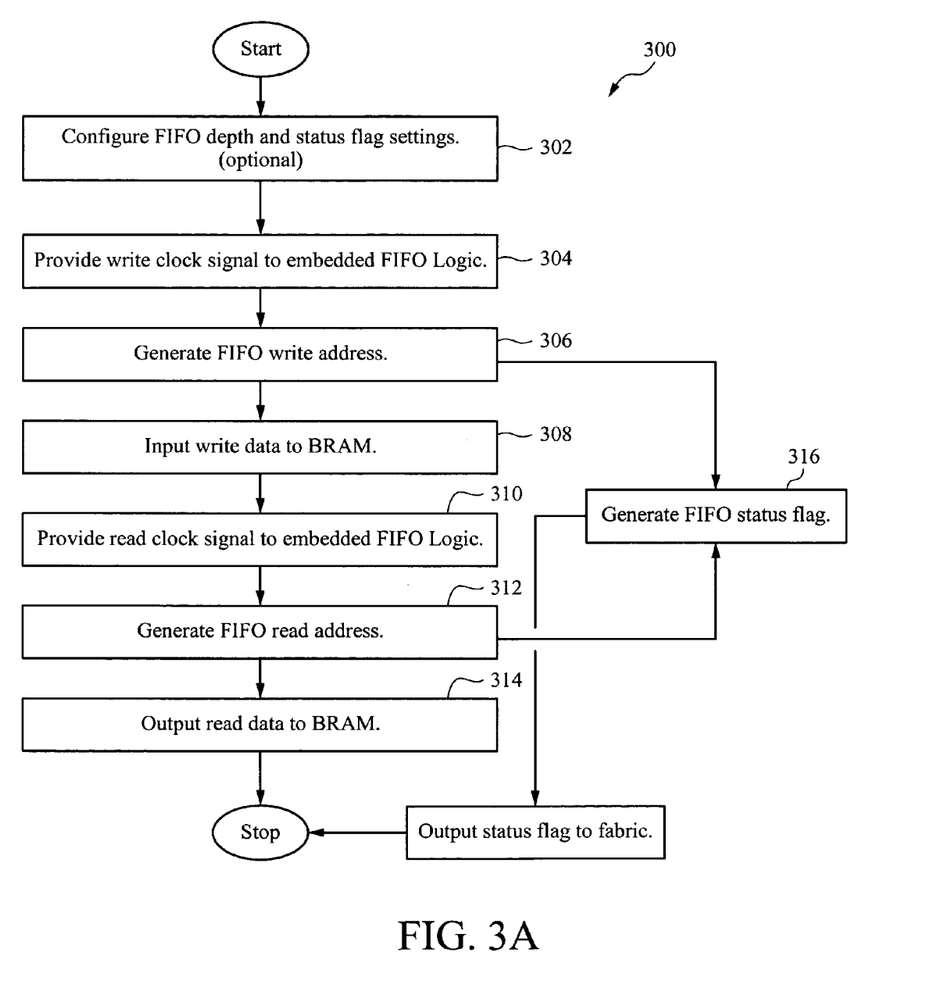
FIG. 3A is a simplified flow chart of a method of operating a programmable logic device as a FIFO memory system according to an embodiment of the present invention.

FIG. 3A is a simplified flow chart of a method of operating a programmable logic device as a FIFO memory system 300 according to an embodiment of the present invention. The FIFO memory system is optionally configured to operate at a selected data width or depth (step 302) when the programmable logic device is booted up. A write enable signal is provided to embedded FIFO logic (step 304) and the embedded FIFO logic generates a FIFO write address (step 306). Write data is input to a BRAM (step 308) at the FIFO write address.

A read enable signal is provided to the embedded FIFO logic (step 310), and the embedded FIFO logic generates a FIFO read address (step 312). Read data at the FIFO read address is output from the BRAM (step 314).

The FIFO memory system tracks read and write addresses to generate FIFO status flags. If the BRAM (FIFO buffer) is full, almost full, empty, or almost empty, a FIFO status flag is generated (step 316) and output to the fabric portion of the programmable logic device. The FIFO ALMOST FULL and FIFO ALMOST EMPTY FIFO status flags are optionally set at boot-up (e.g. step 302). In a further embodiment the programmable logic device includes a register(s) to dynamically set the width of the FIFO data and/or the levels of the FIFO status flags.

Figure 3B:
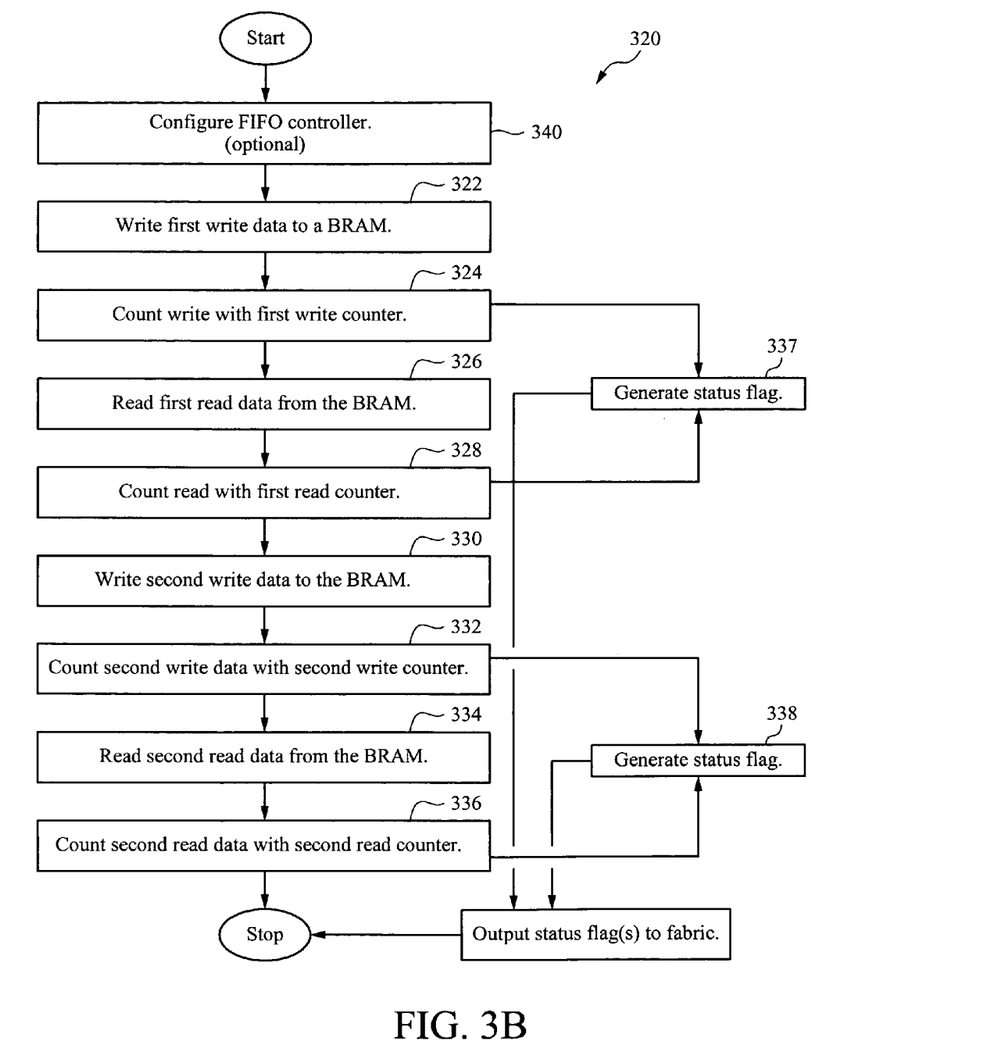
FIG. 3B is a simplified flow chart of a method of operating a programmable logic device according to another embodiment of the present invention.

FIG. 3B is a simplified flow chart of a method of operating a programmable logic device 320 according to another embodiment of the present invention. An embedded BRAM of the programmable logic device serves as the memories, or buffers, for two independent FIFO memory systems. The first independent FIFO logic controls a first FIFO memory system and a second independent FIFO logic controls a second FIFO memory system. The first and second FIFO logic controllers independently track read and write operations and independently generate memory addresses. Thus, the first and second FIFO logic controllers generate independent FIFO status flags.

In one example, first write data is written to a BRAM (step 322), and is counted (step 324) with a first write counter. First read data is read from the BRAM (step 326) and is counted (step 328) with a first read counter. Second write data is written to the BRAM (step 330), and is counted (step 332) with a second write counter. Second read data is read from the BRAM (step 334) and is counted (step 336) with a second read counter. In a further embodiment, a first set of FIFO status flags is generated with a first FIFO controller (step 337) and a second set of FIFO status flags is generated with a second FIFO controller (step 338).

In a further embodiment, one or both FIFO controllers are configured to set the data width/depth of one or both memory arrays, and/or the limits for FIFO ALMOST FULL and FIFO ALMOST EMPTY flags. In one embodiment, the FIFO controller(s) are configured at boot-up for FIFO data width/depth and/or the first and second programmable FIFO status flags, ALMOST FULL and ALMOST EMPTY are set at selected levels of the FIFO depth. In a further or alternative embodiment, the FIFO controller(s) are dynamically configured (i.e. after boot-up, while the FIFO memory system(s) are operating).

Further details on embodiments of the present invention are disclosed in concurrently filed, commonly assigned, U.S. Patent Application, entitled FIRST-IN, FIRST-OUT BUFFER SYSTEM IN AN INTEGRATED CIRCUIT, by Wayson Lowe, Eunice Hao, Tony Ngai, Peter H. Alfke, and Jennifer Wong, the patent application of which is hereby incorporated by reference in its entirety.

In the foregoing specification, the invention has been described with reference to specific exemplary embodiments thereof. Other embodiments will be apparent to those of ordinary skill in the art. For example, specific embodiments have been discussed with reference to FPGAs and CPLDs; however, embodiments of the invention might be implemented in other types of PLDs. Thus, it is evident that various modifications and changes may be made thereunto without departing from the broader spirit and scope of the invention as set forth in the appended claims and their full scope of equivalents.

The invention claimed is:

1. A programmable logic device comprising:
    an embedded block of random access memory ("BRAM");
    a first first in, first out ("FIFO") logic in the programmable logic device coupled to the embedded BRAM to provide a first FIFO memory system;
    a second FIFO logic in the programmable logic device coupled to the embedded BRAM to provide a second FIFO memory system;
    a fabric portion of the programmable logic device; and
    wherein a first portion of the BRAM is operated as a first dual-port random access memory of the first FIFO memory system and a second portion of the BRAM is operated as a second dual-port random access memory of the second FIFO memory system.

2. The programmable logic device of claim 1 wherein at least one of the first FIFO logic and the second FIFO logic is embedded in the programmable logic device.

3. The programmable logic device of claim 1 wherein the first FIFO logic is embedded in the programmable logic device and the second FIFO is embedded in the programmable logic device.

4. The programmable logic device of claim 1 wherein at least one of the first FIFO logic and the second FIFO logic is configured in the fabric portion of the programmable logic device.

5. The programmable logic device of claim 1 wherein the first FIFO memory system uses a first half of the BRAM and the second FIFO memory array uses a second half of the BRAM.

6. The programmable logic device of claim 1 wherein the BRAM has a maximum data width and the first FIFO memory system has a first data width essentially equal to the maximum data width and the second FIFO memory system has a second data width essentially equal to the maximum data width.

7. The programmable logic device of claim 6 wherein the first FIFO memory system has a first FIFO buffer depth and the second FIFO memory system has a second FIFO buffer depth, the first FIFO buffer depth being essentially equal to the second FIFO buffer depth.

8. The programmable logic device of claim 1 wherein the first FIFO memory system is operated in parallel with the second FIFO memory system.

9. The programmable logic device of claim 1 wherein the second FIFO memory system is operated in series with the first FIFO memory system.

10. The programmable logic device of claim 1 wherein the programmable logic device is a field-programmable gate array device.

11. The programmable logic device of claim 1 wherein the programmable logic device is a complex programmable logic device.

12. The programmable logic device of claim 1 wherein the embedded BRAM includes
a first data input port,
a first data output port,
a second data input port,
a second data output port,
a first write port,
a first write address port,
a first read port,
a first read address port,
a second write port,
a second write address port,
a second read port, and
a second read address port.

13. The programmable logic device of claim 1 wherein the first FIFO logic includes a first FIFO controller providing a first set of FIFO status flags and wherein the second FIFO logic includes a second FIFO controller providing a second set of FIFO status flags.

14. The programmable logic device of claim 1 wherein the first FIFO logic includes
a first FIFO controller coupled to the BRAM,
a first write counter coupled to the embedded BRAM, and
a first read counter coupled to the embedded BRAM, and
wherein the second FIFO logic includes
a second FIFO controller coupled to the embedded BRAM,
a second write counter coupled to the embedded BRAM, and
a second read counter coupled to the embedded BRAM.

15. The programmable logic device of claim 14 wherein each of the first FIFO controller, first write counter, first read counter, second FIFO controller, second write counter and second read counter are embedded in the programmable logic device.

16. The programmable logic device of claim 14 wherein the first FIFO controller provides a first set of FIFO status flags and the second FIFO controller provides a second set of FIFO status flags.

17. The programmable logic device of claim 1 wherein at least one of the first FIFO memory system and the second FIFO memory system is an asynchronous FIFO memory system.

18. The programmable logic device of claim 1 wherein the first FIFO memory system is a first asynchronous memory system and the second FIFO memory system is a second asynchronous FIFO memory system.

19. A programmable logic device comprising:
an embedded block of random access memory ("BRAM");
a first first in, first out ("FIFO") logic in the programmable logic device coupled to the embedded BRAM to provide a first FIFO memory system;
a second FIFO logic in the programmable logic device coupled to the embedded BRAM to provide a second FIFO memory system; and
a fabric portion of the programmable logic device; and
wherein the first FIFO logic includes a first FIFO controller providing a first set of FIFO status flags and wherein the second FIFO logic includes a second FIFO controller providing a second set of FIFO status flag.

20. A programmable logic device comprising:
an embedded block of random access memory ("BRAM");
a first first in, first out ("FIFO") logic in the programmable logic device coupled to the embedded BRAM to provide a first FIFO memory system;
a second FIFO logic in the programmable logic device coupled to the embedded BRAM to provide a second FIFO memory system; and
a fabric portion of the programmable logic device; and
wherein the first FIFO logic includes:
a first FIFO controller coupled to the BRAM,
a first write counter coupled to the embedded BRAM, and
a first read counter coupled to the embedded BRAM; and
wherein the second FIFO logic includes:
a second FIFO controller coupled to the embedded BRAM,
a second write counter coupled to the embedded BRAM, and
a second read counter coupled to the embedded BRAM.

* * * * *